United States Patent
McCullough et al.

(10) Patent No.: US 6,389,690 B1
(45) Date of Patent: May 21, 2002

(54) METHOD OF COATING PRINTED CIRCUIT BOARD

(75) Inventors: Randy L. McCullough, Charleston; John Lee Wayt, St. Albans; James N. Butch, Charleston, all of WV (US)

(73) Assignee: American Meter Company, Scott Depot, WV (US)

(*) Notice: Subject to any disclaimer, the term of this patent is extended or adjusted under 35 U.S.C. 154(b) by 0 days.

(21) Appl. No.: 09/294,252

(22) Filed: Apr. 19, 1999

Related U.S. Application Data

(62) Division of application No. 08/988,760, filed on Dec. 11, 1997.

(51) Int. Cl.⁷ .................................................. H05K 3/34
(52) U.S. Cl. .............................. 29/840; 29/825; 29/832; 427/96; 427/97
(58) Field of Search ......................... 29/841, 840, 832, 29/825; 427/96, 97

(56) References Cited

U.S. PATENT DOCUMENTS

| | | | |
|---|---|---|---|
| 4,278,707 A | 7/1981 | Biran | 427/96 |
| 4,490,496 A | 12/1984 | Maekawa et al. | 524/317 |
| 4,698,240 A | 10/1987 | Ono et al. | 427/58 |
| 4,830,922 A | 5/1989 | Sparrowhawk et al. | 428/411.1 |
| 4,839,642 A | 6/1989 | Batz et al. | 340/825.54 |
| 5,061,776 A | 10/1991 | Weaver et al. | 528/66 |
| 5,153,986 A | 10/1992 | Brauer et al. | 427/97 |
| 5,326,589 A | 7/1994 | Okinoshima et al. | 427/79 |
| 5,336,928 A | 8/1994 | Neugebauer et al. | 257/700 |
| 5,409,733 A | 4/1995 | Boger et al. | 427/96 |
| 5,443,672 A | 8/1995 | Stoll et al. | 156/244.17 |
| 5,460,767 A | 10/1995 | Sanftelben et al. | 264/263 |
| 5,510,138 A | 4/1996 | Sanftleben et al. | 427/96 |
| 5,543,008 A | 8/1996 | Hidber et al. | 156/229 |
| 6,052,893 A | * 4/2000 | Yoshida et al. | |

OTHER PUBLICATIONS

Replacement of chlorinated solvents for defluxing surface mount hybrids and PWBs with an environmentally sound alternative by Gillum et al, pp 603–612, Proc Surface Mount International date of Conference Aug. 31–Sep. 2, 1993.*

Untersuchung an schutzlackieten Leiterplatten unter Feuchteewirkung by Schweigart NTIS Publication Accession Code TIB/A96–01318 Feb. 23, 1995 58 pages (in Gerrman).*

* cited by examiner

Primary Examiner—Carl J. Arbes
(74) Attorney, Agent, or Firm—MacCord Mason PLLC

(57) ABSTRACT

A conformal coating and method for applying same to a printed electrical circuit board, components and leads for providing corrosion resistance. In a preferred embodiment, the conformal coating comprises a first coating layer of parylene which is vacuum deposited and removably bonded onto an ultra-clean surface of a printed circuit board including attached components and leads. Additionally, a second coating layer of a corrosion inhibiting viscous fluid is deposited onto the first coating layer to form a continuous, stratified, conformal coating which is sealed and corrosion resistant.

11 Claims, 1 Drawing Sheet

METHOD OF COATING PRINTED CIRCUIT BOARD

This is a divisional aplication of Ser. No. 08/988,760, filed Dec. 11, 1997, pending.

FIELD OF THE INVENTION

The present invention relates generally to a conformal coating and methods for conformally coating a substrate to provide corrosion resistance, and more particularly, to a conformal coating and method for conformally coating printed electrical circuit boards and the components mounted thereto to provide corrosion resistance.

BACKGROUND OF THE INVENTION

Low power, battery operated environments present an environment where electronics are more susceptible to humidity-induced environmental changes. A particularly acute need exists in commercial utility meters such as natural gas meters, water meters or electric meters. Such applications are exposed to temperature extremes of −40° F. to 160° F., in varying humidity conditions, and sometimes even immersed in water. Additionally, battery life in such commercial utility meters must extend to 10 or more years in certain applications. Given the low power environment inherent in extended battery life applications, the electronics are configured to periodically awaken from an ultra-low power idle state for processing.

The electronics are implemented on printed circuit boards having electronic components such as integrated circuits, crystals, inductors, batteries, resistors, capacitors, diodes, transistors, switches and sockets. Each of these components has leads which mount to the surface of the printed circuit board, as in surface mount applications, or extend through the circuit board as in traditional thru-hole applications. Conformal coatings for printed electrical circuit boards, including the components and the associated leads, and techniques for coating the same have been used to prevent corrosion and shorting from exposure to humid conditions. However, many conformal coatings, in particular, the widely used acrylic-based coatings, often delaminate or pull away from the corners of leads and boards and develop cracks which wick moisture during temperature and humidity cycles. These cracks and areas of delamination form pockets which may entrap water and dissolve and/or disassociate contaminants confined therein. These contaminants may eventually form dendritic growths between component leads, which lead to shorts, excessive power consumption and board malfunctions. These problems are exacerbated in low power, battery operated environments where moisture and dendritic formations between leads project a relatively low impedance, with respect to the high impedance battery application.

Therefore, there remains a need for a conformal coating for printed circuit boards which will provide moisture and corrosion resistance for the printed circuit boards and the components mounted thereto without cracking or delaminating.

SUMMARY OF THE INVENTION

The present invention provides circuit boards and their associated components with a protective conformal coating, which is sealed and corrosion resistant, thus eliminating cracks and spaces that would result from incomplete coating coverage or delamination and the influx of water and contaminants that can cause shorting and corrosion of leads. This allows indefinite operation of low-powered electronics in varying moisture environments, or even submerged in water.

The present invention is directed to a protective conformal coating and method for applying the same to printed circuit boards and the components thereon to provide a corrosion resistant, sealed, stratified coating which eliminates cracks and delamination, thereby providing corrosion and moisture resistance when exposed to humid conditions. Further, the present invention provides a protective conformal coating for circuit boards which allows for repair and reapplication or recovering of the board, components, and component leads.

Preferably, the protective conformal coating comprises a first coating layer of a material selected from the group mainly consisting of parylene, urethane, acrylics, epoxies and silicones which is deposited onto an ultra-clean printed circuit board having a multiplicity of components. Although all of these conformal coating materials are believed acceptable substitutes for the first coating, preferably, parylene is used for the first coating.

Typically, the ultra-clean circuit board is cleaned to approximately about less than 20 micrograms per square inch NaCl equivalent. For best results, the printed circuit board is cleaned to approximately about less than 5 micrograms per square inch NaCl equivalent. The parylene or equivalent coating which is deposited on the ultra-clean circuit board provides a bonded coating that will not delaminate from the printed circuit board, the mounted components or the component leads. It is important that the first coating layer is deposited to cover most, if not all, of the exposed surfaces of the board, components and leads. Care should be taken to coat between and behind lead surfaces. Further, the first coating layer of parylene is removable and redepositable, thereby allowing for board repair and recoating, as necessary.

Typically, the protective conformal coating further comprises a second coating layer comprising a corrosion inhibiting viscous fluid applied onto the first coating layer, thereby filling in gaps and flexible openings occurring in the first coating layer. The corrosion inhibiting lubricant is capable of withstanding corrosive environments and provides a sealed, stratified coating. Like the first coating, the second coating should cover most, if not all, of the printed circuit board, components and lead surfaces. Where the first coating layer is removed and reapplied, the second coating layer of corrosion inhibiting viscous fluid is also reapplied to reseal the printed circuit board, components, and leads.

Accordingly, one aspect of the present invention is to provide a protective conformal coating for a substrate which is corrosion resistant. It is another aspect of the present invention to provide a conformally coated printed circuit board, including components and leads, which is sealed and corrosion resistant. Still another aspect of the present invention is to provide a method for conformally coating a printed circuit board, including components and leads.

DETAILED DESCRIPTION OF THE PREFERRED EMBODIMENT

Figure 1:
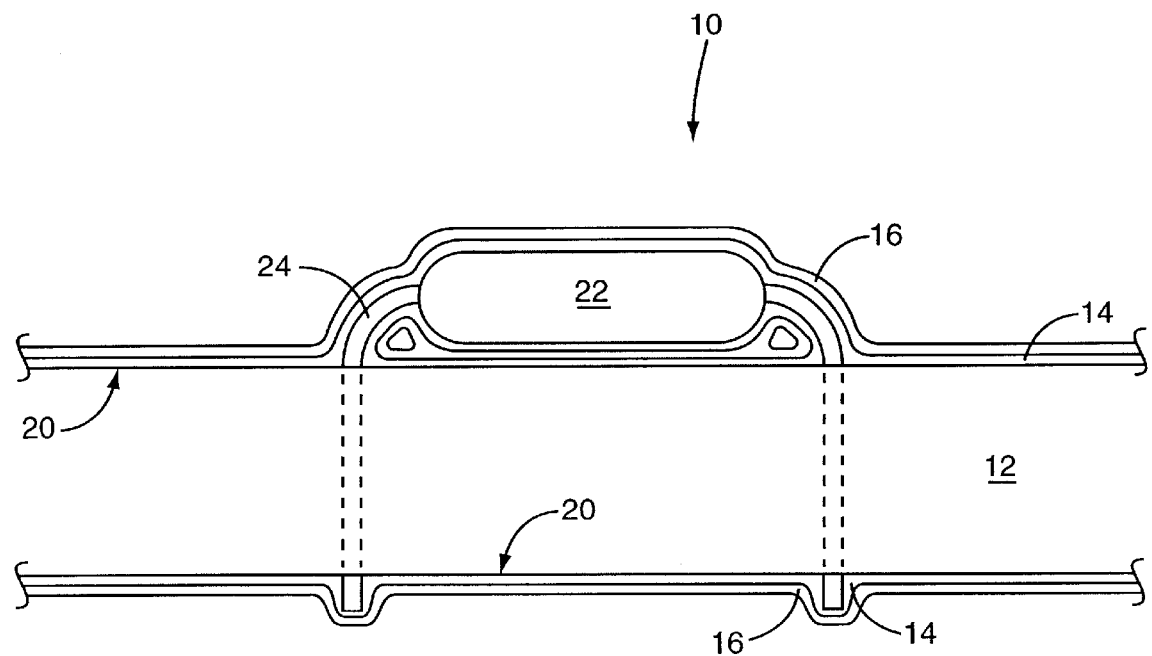
FIG. 1 is an enlarged sectional view of a conformally coated printed circuit board according to the present invention.

It will be understood that the illustration is for the purpose of describing a preferred embodiment of the invention and is not intended to limit the invention thereto. FIG. 1 shows a conformally coated printed circuit board, generally designated 10, including a typical printed circuit board 12 with regular or surface-mount electronic components 22 mounted thereon. The components 22 generally include leads 24 for mounting and providing electrical connection of the components 22 to the printed circuit board 12. After components 22 are mounted to the printed circuit board 12, the "stuffed" board is thoroughly cleaned to remove possible contaminants and solder residue.

After cleaning, a first coating layer 14 is deposited on most, and preferably all, board 12, component 22 and lead 24 surfaces that may be potentially exposed to air, moisture or water. Although depositing the first coating layer 14 on all surfaces may be impractical or impossible, efforts should be made to maximize coverage. Board cleaning and coating compositions are discussed in detail below. A second coating layer 16 is deposited onto the first coating layer 14, thereby providing a continuous, conformal, stratified coating 14, 16 which is sealed and corrosion resistant over the surface of the board, components and respective leads.

Experiments have shown that the printed circuit board must be cleaned to an extent greater than that set by MIL specifications, which are 20 micrograms per square inch NaCl equivalent. Providing an ultra-clean circuit board which is cleaned to approximately about less than 20 micrograms per square inch NaCl equivalent, and more preferably approximately about less than 5 micrograms per square inch NaCl equivalent, ensures complete and consistent bonding of the first coating layer to the ultra-clean printed circuit board while removing contaminants likely to lead to corrosion and/or dendritic growths. The method of cleaning selected will be affected by the flux used in soldering to the board, as will be apparent to those of ordinary skill in the art. Experimentation has determined that cleaning after using "no-clean" or "aqueous" flux for soldering provides the best results. Complete and consistent bonding are critical to minimizing delamination and cracks in the first coating 14. Therefore, providing an ultra-clean surface to which the first coating layer is applied is an important aspect of the present invention. The following table illustrates the relationship between board surface cleanliness and conformal coating application effectiveness.

| Board Surface Cleanliness | Effectiveness (1–5 scale) |
| --- | --- |
| 20 $\mu$g NaCl equivalent | 1 |
| 10 $\mu$g NaCl equivalent | 3 |
| 5 $\mu$g NaCl equivalent | 4 |
| 2 $\mu$g NaCl equivalent | 5 |
| 1 $\mu$g NaCl equivalent | 5 |

In the preferred embodiment, the first coating layer comprises a material generally selected from the group consisting of parylene, urethane, acrylic, epoxy, and silicone-based resins. Most preferably, the first coating layer comprises parylene, which provides a bonded coating that will not delaminate from the printed circuit board or parts mounted thereto. The chemical composition of parylene is $C_{16}H_{14}C_{12}$. Furthermore, the use of parylene allows for board repair, via partial coating removal and redeposition, as necessary. The first coating 14 is preferably vacuum deposited on the ultra-clean circuit board and components mounted thereon to maximize coverage of board, component and lead surfaces while providing uniform deposition.

Also in the preferred embodiment, the second coating layer comprises a corrosion inhibiting viscous fluid which fills in the gaps, movable areas and flexible openings occurring in the first coating layer due to variations or openings in the first layer or openings caused by board topography or component configuration, such as openings or areas associated with movable parts and switches. After application of the first coating 14, the "stuffed" board is preferably dipped in the corrosion-inhibiting viscous fluid, which forms a viscous layer which seals the first coating 14 and any areas of possible penetration left thereby. Notably, the first and second coating also function to filter out contaminants in water that may ultimately reach a board, component, or lead surface. In most cases, the contaminants are more harmful than the water.

The corrosion inhibitor generally comprises a mixture of high molecular weight (HMW) compounds and low molecular weight (LMW) compounds. The low molecular weight compounds are volatile and act as a carrier to distribute the high molecular weight compounds over all surfaces and into the cracks and crevices within these surfaces. During a curing process, the LMW compounds evaporate leaving behind the HMW compounds, which have a very low vapor pressure and as a result remain flexible for extended periods of time and provide continuous coverage. The preferred corrosion inhibiting viscous fluid is manufactured by Elektro-tech and sold under the brand name Elektro-tech B Super-core.

Furthermore, the coating disclosed and claimed herein substantially minimizes the risk of water penetrating the coating layer so as to form a connection with and between the component leads. Sometimes gaps are formed by drilling or machining after application of the parylene. The corrosion inhibiting viscous fluid is capable of withstanding corrosive environments and provides a sealed final coating.

The second coating layer 16 operates in conjunction with the first coating layer 14 to provide a continuous, stratified coating which conforms to the circuit board and components thereon. After cleaning and application of the coatings 14,16, the "stuffed" board is sealed, delamination resistant, and corrosion resistant.

Certain modifications and improvements will occur to those skilled in the art upon reading the foregoing description. It should be understood that all such modifications and improvements have been deleted herein for the sake of conciseness and readability but are properly within the scope of the following claims.

What is claimed is:

1. A method for conformally coating an electrical circuit board, and components leads mounted thereon, said method comprising the steps of:

cleaning said electrical circuit board to provide an ultra-clean surface thereon;

depositing a first coating layer onto said ultra-clean surface; and depositing a second coating layer onto said first coating layer;

whereby said first coating layer and said second coating layer form a stratified coating which adheres to said ultra-clean surface thereby protecting said electrical circuit board from corrosion.

2. The method according to claim 1, wherein the cleaning step comprises cleaning the surface to approximately about less than 20 micrograms per square inch NaCl equivalent.

3. The method according to claim 1, wherein the cleaning step comprises cleaning the surface to approximately about less than 5 micrograms per square inch NaCl equivalent.

4. The method according to claim 1, wherein the first deposition step is vacuum deposition.

5. The method according to claim 1, further comprising the preliminary step of soldering components to said electrical circuit board with a solder having a flux which is one of the group consisting of a "no-clean" and "aqueous-clean" flux.

6. The method according to claim 1, wherein the first deposition step comprises depositing a material selected from the group consisting of parylene, urethane, acrylics, epoxies and silicones.

7. The method according to claim 1, wherein the second deposition step comprises depositing a corrosion inhibiting viscous fluid.

8. The method according to claim 7, further comprising subsequent removing and redepositing the first coating layer.

9. The method according to claim 1, wherein the second deposition step seals and forms a stratified coating that is non-delaminatable.

10. A method for conformally coating an electrical circuit board and a multiplicity of components connected via respective component leads therewith, said method comprising the steps of:

cleaning said electrical circuit board, components and leads, to provide an ultra-clean surface thereon;

depositing a first coating layer onto said ultra-clean surface; and depositing a second coating layer onto said first coating layer to form a continuous, stratified coating which is conformally and removably bonded to the ultra-clean surface, thereby protecting said electrical circuit board and said multiplicity of components and said respective component leads from corrosion.

11. The method according to claim 10, wherein the first deposition step comprises depositing parylene and the second deposition step comprises a corrosion inhibiting viscous fluid.

* * * * *